(12) United States Patent
Bona et al.

(10) Patent No.: US 7,235,464 B2
(45) Date of Patent: Jun. 26, 2007

(54) PATTERNING METHOD

(75) Inventors: Gian-Luca Bona, San Jose, CA (US); Bruno Michel, Adliswil (CH); Hugo Eric Rothuizen, Adliswil (CH); Peter Vettiger, Langnau am Albis (CH); Han Biebuyck, Rockville, MD (US)

(73) Assignee: International Business Machines Corporation, Armonk, NY (US)

( * ) Notice: Subject to any disclaimer, the term of this patent is extended or adjusted under 35 U.S.C. 154(b) by 325 days.

(21) Appl. No.: 10/485,419

(22) PCT Filed: May 28, 2003

(86) PCT No.: PCT/IB03/02278

§ 371 (c)(1),
(2), (4) Date: Feb. 2, 2005

(87) PCT Pub. No.: WO03/102691

PCT Pub. Date: Dec. 11, 2003

(65) Prior Publication Data
US 2005/0124092 A1    Jun. 9, 2005

(30) Foreign Application Priority Data
May 30, 2002    (EP) ................... 02405431

(51) Int. Cl.
*H01L 21/78* (2006.01)
*H01L 21/46* (2006.01)
*H01L 21/76* (2006.01)
*C03C 1/22* (2006.01)
*C03C 25/68* (2006.01)

(52) U.S. Cl. ............ 438/462; 438/401; 438/975; 216/54; 216/44; 216/52

(58) Field of Classification Search ........... 438/462, 438/401, 975, 690, 700, 759; 216/54, 44, 216/52
See application file for complete search history.

(56) References Cited

U.S. PATENT DOCUMENTS

| | | | |
|---|---|---|---|
| 5,772,905 A * | 6/1998 | Chou | 216/44 |
| 6,482,742 B1 * | 11/2002 | Chou | 438/690 |
| 6,656,398 B2 * | 12/2003 | Birch et al. | 264/85 |
| 6,966,997 B1 * | 11/2005 | Inganas et al. | 216/36 |
| 7,026,012 B2 * | 4/2006 | Chen et al. | 427/304 |
| 7,117,790 B2 * | 10/2006 | Kendale et al. | 101/327 |

* cited by examiner

*Primary Examiner*—Luan Thai
(74) *Attorney, Agent, or Firm*—Robert M. Trepp

(57) ABSTRACT

The invention relates to a method for creating a pattern on a substrate comprising a first alignment structure, using an elastomeric stamp comprising a patterning structure and a second alignment structure. The method comprises a moving step for moving the elastomeric stamp towards the substrate, and a deformation step for deforming the patterning structure with a tensile or compressive force generated by cooperation of the first alignment structure and the second alignment structure.

8 Claims, 3 Drawing Sheets

PATTERNING METHOD

The present invention relates in general to the formation of a pattern such as a grating array on a substrate. More specifically, the invention relates to the formation of such a grating array on a substrate suitable for fiber optic communication systems. Still more specifically, the invention relates to the adaptation of such a grating array to a desired periodicity or wavelength.

BACKGROUND OF THE INVENTION

Optical fiber networks are the backbone for today's most important communication technologies. Optical signals generated by, e.g., infra-red lasers carry all manner of data across these networks by high speed modulation of the intensity of their light, decoded subsequently into the now familiar 1s and 0s of digital information. The last twenty years resulted in billions of dollars of investment in the placement of such fiber networks, often in locations not easily accessible like ocean floors and underneath roadways. Most of this fiber is single mode, i.e., allowing the passage of light only within a narrow spectral window, so that earlier attention to increasing the capacity of these networks focused on ever faster modulation and detection of the laser signals. The transmission bandwidth of single mode optical fiber is wide, but not infinitely so, and thus suggests another approach to increasing its capacity: Propagation of several signals simultaneously, each carried by the modulation of light at a discrete wavelength. This approach, called wavelength division multiplexing (WDM), is also possible albeit technically more difficult to achieve. The key requirement here is that the propagating light be confined to well defined and stable wavelengths with a small spectral dispersion (ideally <0.2 nm) with the constraint that all of the conjoining signals still reside within the spectral bandwidth of the fiber, is achievable by exotic methods. Practical implementation of WDM awaits technologies that provide compact, manufacturable arrays of lasers, separated spectrally by a deterministic frequency (typically 200–400 GHz depending on the fiber), at relatively low cost.

The requisite wavelength definition and stability can result from single frequency lasers using distributed feedback resonators (DFR). The latter, when temperature-stabilized, provide the resistance to wavelength drift and spectral purity necessary for practical implementation and are well known in research and already widely used in this field. Achieving this wavelength accuracy in arrays of DFRs, however, requires an additional step in their manufacture. The needed periodic gratings must have phase-shifts in the period of the grating, centered along the length of the laser cavity, that lock and stabilize the propagating field, with each grating in the array precisely altered in pitch with respect to its neighbor. This alteration in pitch results in a deterministically different wavelength for each laser within the array (true for either multi quantum well type or bulk active mode lasers although the former may offer advantages of manufacture). Assuming adequate control is achieved over the epitaxial film thickness and its composition, accurate and precise definition of the grating pitch is the limiting requirement in the successful manufacture of arrays of DFR lasers. It has to be noted that the requirements in the size of the features are generally below those accessible using conventional optical lithography.

One manufacturing approach for the placement of these gratings on laser mesas uses near-field holography with masters formed by e-beam lithography. The latter provides the necessary resolution and accuracy in pitch and placement of the wavelength phase shifter, while the former has the convenience of parallel formation of features while maintaining high resolution. Here, a grating array in silica results from e-beam lithography to provide a master with typical feature size of about 100 nm at periods of 200 nm, necessary for implementation of DFR lasers at wavelengths of 1.5 µm. An image of the master grating is printed by its exposure, using UV light, of photoresist in contact with the master. Contact transfer of the pattern by near field holography is necessary because it allows the very high resolution required in the formed structures in a manner not practically accessible by projection lithography. This approach, however, suffers from several disadvantages. First, the masters are very expensive to produce, costing $15,000 (about 10 times the cost of conventional masks) and have limited lifetimes (about 50 uses) due to damage and obfuscation of their features under the stresses of mechanical contact with the substrate of the putative array. Second, changing the pitch of the gratings requires the formation of a new master so that compensating absolute changes in the design of the laser mesa requires wholly new grating masters even for slight changes in the targeted spectral range. Third, pattern transfer printing must occur everywhere at once on a wafer. The stresses associated with printing large areas by brittle contact between the silica grating and resist can further erode reproducibility and accuracy of the grating arrays on disparate parts of the wafer.

Recently, the market for fiber optic communication has exploded and the requirements for multi channel spacing has been tightened. Because of the development of the field, more elements like filters and selective couplers have been designed that also rely on one dimensional gratings that need to be adapted to the desired wavelength. This renders the initially small market much more attractive both in number of possible applications and in volume per application. Current fine tuning requirements of DFB lasers, phaser gratings, and filters in optical communication require a tuning in steps of 100 ppm between channels or increments as small as 0.2 nm in the 1500 nm IR band. With such fine tuning the 100 nm wide IR spectral region useful for fibre optic communication could be subdivided into much more than 100 different wavelength bands or channels. Fabrication of such grating arrays directly onto the optical components will be not economic enough and requires new fabrication approaches. The next step to define each of the gratings in a master and to replicate it to the final structure using stamping or other methods is feasible but the variability of the system may require a fine-tunig during manufacturing to guarantee wavelength accuracy of the components, a process that cannot be done through fabrication of a set of masters with slightly shifted overall pitches of the arrays.

Microcontact printing (hereinafter µCP) is a technique for forming patterns of organic monolayers with micrometer and submicron lateral dimensions. It offers experimental simplicity and flexibility in forming certain types of patterns. So far, most of the prior art relies on the remarkable ability of self-assembled monolayers of long chain alkanethiolates to form on, e.g., gold or other metals. These patterns can act as nanometer resists by protecting the supporting metal from corrosion by appropriately formulated etchants, or can allow for the selective placement of fluids on hydrophilic regions of the pattern. Patterns of self-assembled monolayers having dimensions that can be less than 1 micrometer are formed by using the alkanethiol as an "ink", and by printing them on the metal support using an elastomeric "stamp". The stamp is fabricated by molding a silicone elastomer using a master prepared by optical lithography, by e-beam lithography, or by other techniques. Patterning of the surface of such a stamp is, e.g., disclosed in EP-B-0 784 543.

Step-and-flash-imprint lithography, also called micromolding or UV-molding, is a technique that has the potential to replace photolithography for patterning resist with sub-100 nm features. It is a low cost, high throughput alternative to conventional photolithography for high-resolution patterning. It is a molding process in which the topography of a template defines the patterns created on a substrate. This technique uses a low viscosity, photosensitive solution that is hardened by UV after having been patterned by the topographically structured quartz master (cf. M. Colburn et al., J. Vac. Sci. Technol. B, 2162 (2001)).

U.S. Pat. No. 5,817,242 discloses a hybrid stamp structure for lithographic processing of features below 1 micron. The stamp offers means for achieving a self-alignment, this means comprising key-and-lock type topographical features, e.g., cone- or pyramid-shaped protrusions and holes, which after a sufficiently accurate pre-positioning by stepping devices guide the stamp into the desired final position. Especially, the stamp comprises wedge-shaped protrusions exceeding the features of the lithographic pattern, fitting exactly into corresponding recesses of the substrate. The geometrical shape of the features thus causes a fine-adjustment of the stamp and the substrate. Furthermore, this document discloses self-alignment means based on the property or tendency of a liquid to minimize its surface. An efficient self-aligning mechanism is achieved with hydrophilic pads on the surface of both the substrate and the stamp, together with a controlled amount of moisture.

In Y. Xia et al., "Reduction in the Size of Features of Patterned SAMs Generated by Microcontact Printing with Mechanical Compression of the Stamp", Advanced Materials, 7(1995), May, No. 5, p. 471–73, there is disclosed a method for forming patterns with submicrometer-sized features using µCP, in which the relief pattern in a polydimethylsiloxane (PDMS) stamp is first formed with relatively large features (2–10 µm) and then compressed mechanically by the application of lateral force by means of a pair (or two pairs) of small plates. However, the reproducibility of the features is limited by the system used to compress the stamp laterally using pressure applied to the plates that sandwich it. This compression is accomplished using screws.

Finally, the state of the art discloses a stamp device for printing a pattern on a surface of a substrate having a two-sided rigid carrier layer providing on its first side a patterned layer made of a first material and being combined on its second side with a soft layer made of a softer material than the first material.

SUMMARY OF THE INVENTION

The invention relates to a method for creating a pattern on a substrate comprising a first alignment structure, using an elastomeric stamp comprising a patterning structure and a second alignment structure. The method comprises a moving step for moving the elastomeric stamp towards the substrate, and a deformation step for deforming the patterning structure with a tensile force generated by cooperation of the first alignment structure and the second alignment structure.

According to a first aspect of the invention a method of producing a pattern that overcomes the above mentioned disadvantages of the prior art is provided. The method has the advantage that by deformation of the stamp the pattern size of the pattern is determined during the patterning step. Another advantage is that the pattern size is determined by the cooperation of the two alignment structures, hence the substrate determines the pattern size.

Preferred embodiments of the invention are described in the dependent claims.

When a translational movement of the elastomeric stamp relative to the substrate is transformed into the tensile force, this has the advantage that no additional force need be applied. This facilitates the construction of the device for carrying out the method and reduces the probability of a manufacturing error due to a wrong external force.

When the transformation is achieved by the alignment structures being designed to comprise an inclined surface relative to the translational movement and relative to the patterning structure, the translational moevement is translated by a very simple mechanical principle which has the advantage of a simpler construction of the stamp and in particular the alignment structures.

An alignment step for bringing the first alignment structure and second alignment structure together is advantageous to avoid misalignment and effects an approach of the alignment structures for enabling them to cooperate.

When the patterning structure is selected to comprise a grating structure, the method can be advantageously applied to create a grating pattern on the substrate, e.g. for optical purposes. Gratings with different or even varying pitches are very useful in optics. With the method, a grating with a pitch varying across the grating can be easily manufactured.

When the tensile force is generated in two dimensions, preferably orthogonal to each other, the pattern deformation can be achieved in both dimensions, allowing to manufacture more complicated structures, such as gratings with varying pitch in two dimensions.

Whenon the same substrate the tensile force is generated in compressive and elongative direction, the overall deformation of the substrate can be reduced. This allows to generate a deformation difference between the smallest and the largest deformation that can even exceed the deformability of the substrate.

BRIEF DESCRIPTION OF THE DRAWINGS

The invention will be described in more detail hereinafter in connection with the drawings, in which FIGS. 1A to 1C schematically depict self-alignment of a stamp on a substrate according to the prior art.

DETAILED DESCRIPTION OF PREFERRED EMBODIMENTS

In the following the formation of one-dimensional or two-dimensional periodic structures is described, thereby forming gratings designed to interact with electromagnetic waves. Such gratings can be used in conjunction with devices like, e.g., lasers, filters, selective couplers and the like. The described method utilizes an elastomeric stamp to create this structure. A master can be manufactured by e-beam lithography or similar techniques. This master, having a three-dimensional structure of reliefs similar to those that form part of the device to be manufactured, is next duplicated by molding its features into an elastomer, like, e.g., polydimethylsiloxane (PDMS). Other elastomers can be used as well.

Separation of the PDMS from the master releases a "stamp" having a negative of the pattern of reliefs on its surface. Release of the stamp causes only low stress on the surface of the master because of the compliant and elastic nature of materials like PDMS, so that the master can be easily duplicated in this manner several times without noticeable wear. Features molded in the surface of PDMS with scales down to 50 nm are feasible, hence able to preserve the resolution of e-beam lithography.

In a first implementation, the stamp is used for transferring a resist. The stamp carries a relief for forming the grating pattern ultimately transferred to the target device. The stamp is inked on its surface with the resist, i.e. it is coated in a coating step with that material. Alignment of the stamp can rely on the available topography to help guide the grating features to a desired location on the target device. This type of alignment is the consequence of the finite deformability characteristic of elastomeric stamps. These stamps accommodate to non-planar surfaces in a manner that is not possible in pattern transfer techniques using solid masks, and thus allow "lock-and-key" type matching of physical structures on the stamp and substrate.

Figure 1A:
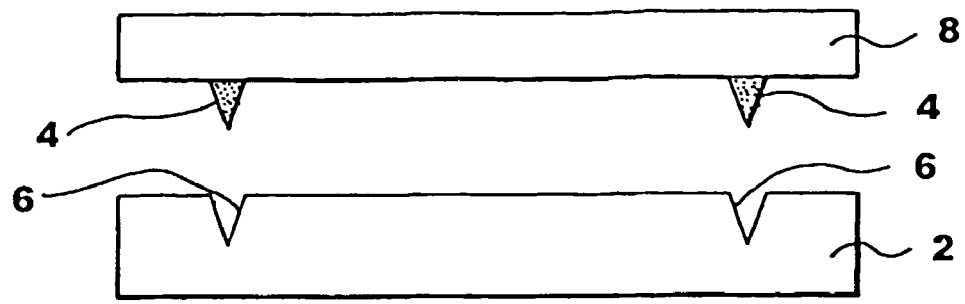

FIG. 1A schematically shows a known lock-and-key-type self alignment. A stamp 8 carries wedge-shaped protrusions 4, made, e.g., of polymethylmethacrylate (PMMA) and protruding beyond the features of a lithographic pattern (not shown). These protrusions 4 fit into corresponding recesses 6 present in a substrate 2. Thus, the geometrical shape of the complementary features, e.g., the tilted sidewalls, cause a fine-adjustment of the stamp 8 relative to the substrate 2.

Figure 1B:
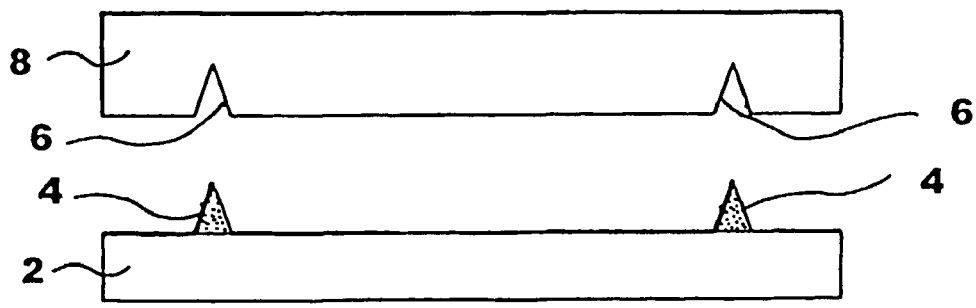

However, it is also possible to provide the protrusions 4 on the substrate 2 and corresponding recesses 6 on the stamp 8 (FIG. 1B).

Figure 1C:
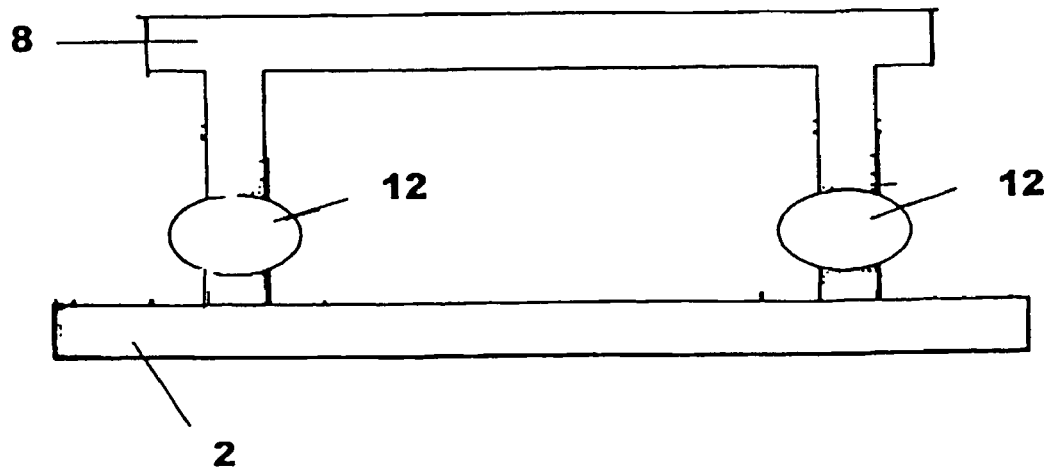

Whereas in the lock-and-key type of self-alignment the tilted sidewalls of the features cause a fine adjustment of the stamp 8 and the substrate 2, FIG. 1C shows means of self-alignment that rely on the tendency of a liquid to minimize its surface. Matching topographically flat zones are used on the stamp 8 and the substrate 2 having a chemically altered surface with higher interaction with a liquid than the other zones. Thereby, capillary forces exerted from a drop of liquid 12 placed between the flat zones will provide alignment forces. With hydrophilic pads on the surface of both the substrate 2 and the stamp 8 together with a controlled amount of moisture leading to the formation of small droplets on and between these pads, a self-aligning mechanism is realized. In case of a small misalignment of the stamp 8 with respect to the substrate 2, the sandwiched droplet provides a restoring force back to the desired overlapping position, thereby moving the stamp 8 into its desired position.

The finite deformability of stamps can also be used in another way. Stretching or pressing an elastomeric stamp 8 results in an isotropic deformation of its features. Thus changes in the desired pitch of the grating can be affected by placing the stamp 8 under a compressive or tensile mechanical stress aligned substantially perpendicular to its features. An absolute change in the pitch of a given grating then result from a deterministic change in this mechanical stress.

For replicating a grating with a very small variation around a given period the relative change is very small. The relative difference between two lasers emitting at 1500 and 1500.2 nm is 0.13% or 133 ppm. This may translate into a pitch difference of the gratings of the two lasers of 450 and 450.06 nm (L=½n), for example. Since the period of the grating used for wavelength stabilization is regular along the length of the laser (several mm), positions on the printed pattern will be defined with accuracies of 0.1 microns over 10.000 microns, a relative accuracy of 10 ppm.

Such accuracy can be achieved when PDMS is molded onto a backplane made from invar, steel, glass or plastic. In this configuration, the maximal distortion that can be generated using a lateral force generated by a lock-and-key mechanism is limited to values below ±0.2%, or 2000 ppm. The thicker and harder the backplane material is, the less relative distortion can be achieved but the more accurate the overall print is. This means that several master gratings can be needed to cover the 100 nm spectral region but that also one master grating can be used to define up to 20 different gratings.

Figure 2:
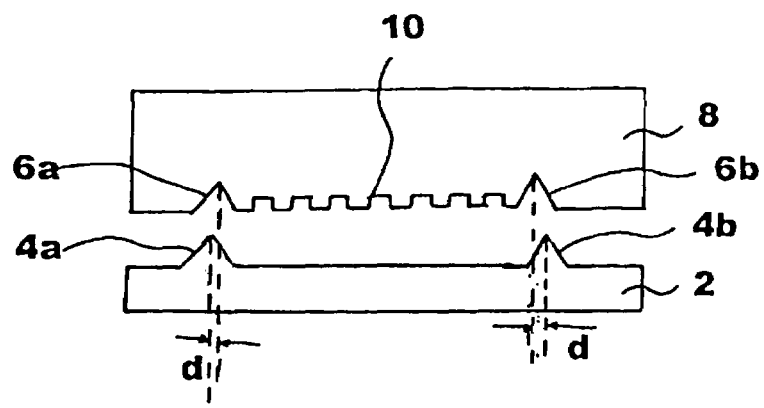
FIG. 2 schematically shows a stamp and a substrate with a non-identical distance of their alignment structures providing for deformation.

FIG. 2 schematically shows the alignment of a stamp 8 and a substrate 2 according to a first embodiment of the present invention. The substrate 2 carries a first alignment structure, which here comprises wedge-shaped protrusions 4a, 4b on its surface. The stamp 8 carries a second alignment structure in form of recesses 6a, 6b that have a form that is complementary to the first alignment structure 4a, 4b. Between the recesses 6a, 6b the stamp 8 has a patterning structure 10 that here comprises a grating having several substantially parallel grating lines. With other words, the patterning structure 10 is selected to comprise a grating structure.

The recesses of the second alignment structure 6a, 6b on the stamp 8 do not exactly fit onto the protrusions 4a, 4b, but, the recesses 6a, 6b show an offset d with respect to the respective protrusions 4a, 4b on the substrate 2. This offset d may for example be in the range of 0.2 microns for adjacent features of the grating, e.g. the grating lines, each with a size of 1 mm and become as large as ten microns when a larger spectral offset is generated. The maximal offset d to create a 50 nm difference would be 5% or 50 microns over a mm, a deformation which cannot be maintained using known thin-film stamp approaches.

The patterning structure 10 can be coated in a coating step. The coating can comprise an ink, a molecular layer, or any other chemical of biochemical matter.

In a moving step, the elastomeric stamp 8 is moved towards the substrate 2. An alignment step can be used for bringing the first alignment structure and second alignment structure together, in particular controlling the position of the stamp 8 relative to the substrate 2 in lateral direction, i.e. substantially parallel to the substrate surface to be patterned.

The alignment structures 4a, 4b, 6a, 6b approach each other and come into contact. Then follows a deformation step for deforming the patterning structure 10 with a tensile force. This force is generated by cooperation of the first alignment structure 4a, 4b with the second alignment structure 6a, 6b. The protrusions 4a, 4b on the substrate 2 are harder and less elastic than the elastomeric material of the stamp 8. Typically the protrucions 4a, 4b are made of the same or a similar material as the substrate 2, e.g. silicon, or silica. Hence, the stamp 8 is deformed, adapting to the first alignment structure 4a, 4b. By the deformation, the pattern generated on the substrate 2 can be larger, as is the case in FIG. 2, or smaller than the corresponding patterning structure 10 on the stamp 8. This allows to use a larger patterning structure 10 for generating smaller patterns, or the other way round.

The translational movement of the elastomeric stamp 8 relative to the substrate 2, which here is the approaching movement, substantially orthogonal to the substrate surface, is transformed into the tensile force that deforms the stamp 8. This advantageously combines the contacting between the stamp 8 and the substrate 2 with the desired deformation. No additional external force is necessary. This adds the further advantage that the tensile force generated is exactly the force that is necessary to achieve the desired deformation, which adds a degree of precision to the method. The stamp 8 itself is only subjected to the tensile force during the contact which reduces the time during which the stamp 8 is stressed. That increases the overall lifetime of the stamp 8.

The transformation is here achieved by the alignment structures 4a, 4b, 6a, 6b being designed to comprise an inclined surface relative to the translational movement and relative to the patterning structure 10.

Once the stamp 8 has been moved towards the substrate 2 such that, by the deformation following the tensile force, the alignment structures 4a, 4b, 6a, 6b of the stamp 8 and of the substrate 2 match, the patterning structure 10 gets into contact with the substrate 2 whereby the material with which the patterning structure 10 has been coated before is enabled to pattern the substrate 2, i.e. to modify the substrate 2 surface in a specific area. Such modification can be a partial or complete transfer of the coating material, etching, a chemical reaction or even a physical modification like an embossing, for which the coating step might be renounced.

Once the pattern has been created on the substrate 2, the stamp 8 can be removed from the substrate 2. During that removing step a deformation of the stamp 8 occurs by reduction of the tensile force and the elasticity of the stamp 8.

The stamp 8 can be reused on a different substrate 2. On that substrate 2 again a first alignment structure 4a, 4b will be present to interact with the second alignment structure 6a, 6b on the stamp 8. The resulting deformation can in that case be of a different magnitude and/or direction. In one case of use the stamp 8 can be subjected to compressing tensile stress and in another case of use the stamp 8 can be subjected to elongative or stretching tensile stress.

It is also advantageous to combine on the same stamp 8 a local zone under elongative stress with a local zone under compressive stress so that the total deformation of the stamp 8 is reduced.

A global deformation that stretches all features of the grating 10 can be achieved by changing the temperature during molding or during printing making use of the differential expansion coefficient between a backplane and the master or between the backplane and the substrate 2. This is the preferred approach to simultaneously distort all features of the grating on the stamp 8. A change of the molding temperature by one degree, for example, can be used to stretch the features of the grating by 7 ppm (differential expansion coefficient between steel and silicon—12 ppm/K−5 ppm/K=7 ppm/K). For glass as backplane material, the differential expansion coefficient during molding will be smaller (approximately 1 ppm/K) but depending on the selection of the backplane material isotropic stretch factors between 5 and 2000 ppm can be achieved.

Other approaches for externally applied local deformation can include exertion of a lateral force during cylinder-printing. That force can be applied in addition to the tensile force.

It is also possible that also only one of the recesses 6a, 6b could have the offset d. Thus, when disposing the stamp 8 onto the surface of the substrate 2, the deformation will affect a change of the grating pitch through the lateral tensile force that is generated by the local mismatch of the alignment structures.

The embodiment given in FIG. 2 will thus result in an increase of the pattern size and hence the grating pitch is enlarged. It is also possible to arrange the protrusions 4a, 4b on the stamp 8 and the recesses 6a, 6b on the substrate 2. to decrease the patern size and hence the grating pitch is reduced.

A difference between the change of the pitch resulting in the embodiment shown in FIG. 2 and the method known from the prior art described in Y. Xia et al. is that in the prior art method the change of the pattern size is achieved by applying an external lateral force, e.g., by means of an additional vice, whereas the depicted arrangement makes use of the interaction of the protrusions 4a, 4b on the surface of the substrate 2 and the corresponding recesses 6a, 6b on the elastomeric stamp 8, having the offset d relative to each other. This has the advantage that the degree of deformation is determined in the moment of putting the elastomeric stamp 8 on the substrate 2. Thus, the stamp 8 can be taken from one substrate 2 to another substrate 2 and can there undergo a different degree of deformation without using any additional tools or having to perform any adjustment. Between two uses a cleaning step or a coating step can be performed. The patterning structure 10 can also be modified between two uses.

It is still more advantageous to subject the elastomeric stamp 8 to different deformations within one single patterning process. These deformations may even show different signs, i.e., stretching or compressing. The substrate 2 may thus comprise protrusions which compress the corresponding part of the stamp 8, whereas, at another location of the substrate 2 protrusions are present that effect a stretching of the corresponding part of the stamp 8.

Figure 3:
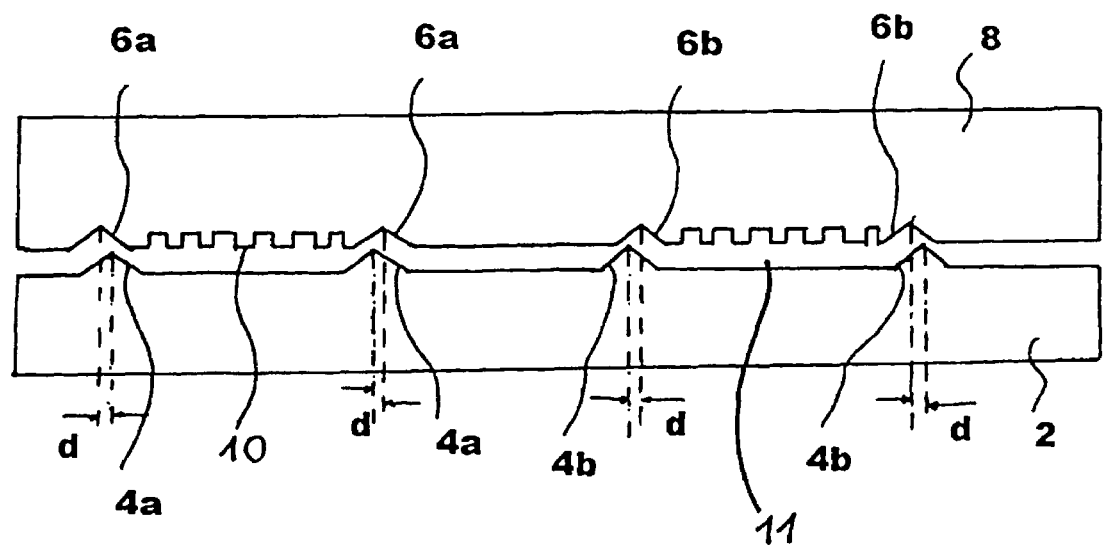
FIG. 3 schematically shows a stamp and a substrate with a non-identical distance of their alignment structures providing for deformation in opposite directions.

An exemplary embodiment herefor is shown in FIG. 3. The substrate 2 here comprises the protrusions 4a, which have a lower distance to each other than the corresponding recesses 6a on the stamp 8 bearing a first pattern 10 as patterning structure between the protrusions 4a. When the stamp 8 is pressed or moved onto the substrate 2, the interaction of the protrusions 4a with the corresponding recesses 6a on the stamp 8, compresses the first pattern 10. The same stamp 8 furthermore comprises the protrusions 4b, which have a bigger distance to each other than the corresponding recesses 6b on the stamp 8 bearing a second pattern 11 as patterning structure between the protrusions 4b. When the stamp 8 is put onto the substrate 2, the interaction of the protrusions 4b with the corresponding recesses 6b on the stamp 8 stretches second pattern 11.

Figure 4:
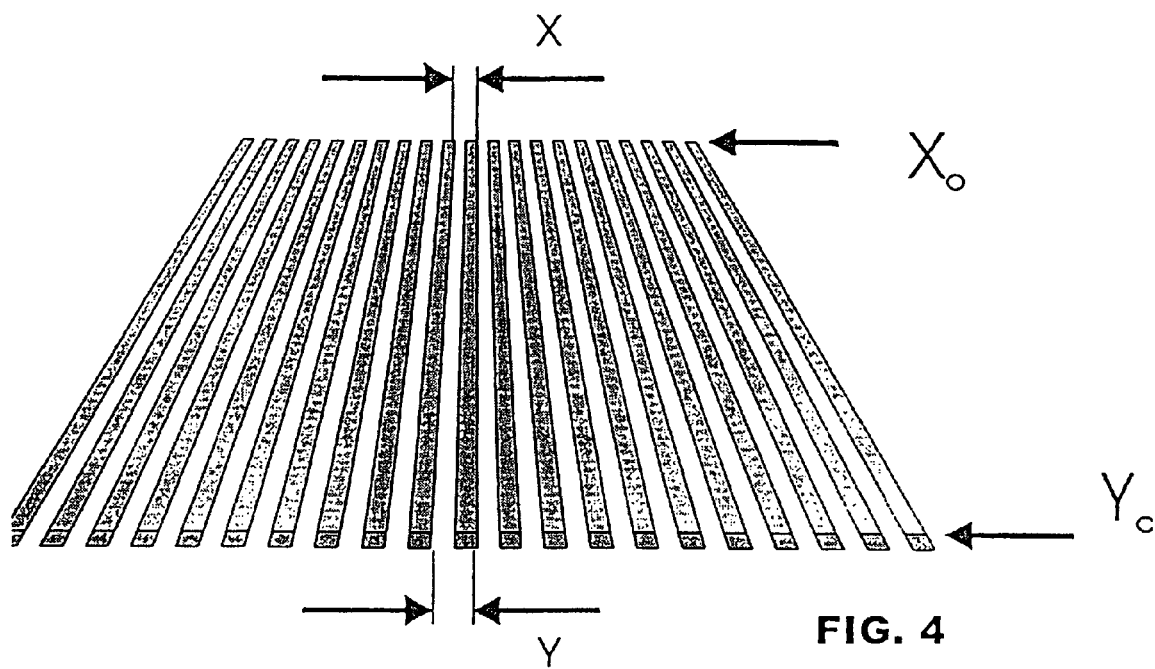
FIG. 4 schematically depicts a grating with continuous deformation.

Furthermore, as shown in FIG. 4, a continuous deformation may be produced, this being especially advantageous for optical structures. FIG. 4 shows a grating with a first pitch x at one end and a second pitch y at the other end. The period of the depicted grating continuously changes from the first pitch x to the second pitch y as one moves from the location Xo to the location Yo. Such a continuously changing pitch is difficult to produce with known lithography methods since these rely on a discrete grid for optical exposure. Using the self-aligning elastomeric stamp 8, such a grating with continuously changing pitch can be generated by having the stamp 8 bear a grating with a pitch (x+y)/2 that during the patterning step is compressed at the location Xo by (y−x)/2 and extended at the location Yo by (y−x)/2.

Thereby the maximum deformation of the stamp 8 is reduced in comparison with an embodiment that uses only stretching or compression. To ensure a continuous transition between the two pitches x, y, either the corresponding alignment structures 4a, 4b, 6a, 6b are themselves substantially continuously arranged on the substrate 2 and on the stamp 8 or they are discretely arranged and spaced close enough to each other that the elasticity of the stamp 8 leads to a substantially continuous deformation.

The patterning with the elastomeric stamp 8 can also be used in a step-and-print type arrangement e.g. in projection lithography. This aspect of patterning is particularly useful in conjunction with a master formed by holography, i.e., where all gratings are formed to have the same pitch, and the deformation of the stamp 8, as described above, is thereafter used to achieve a different wavelength shift for each individual device, group, or array of devices.

Figure 5:
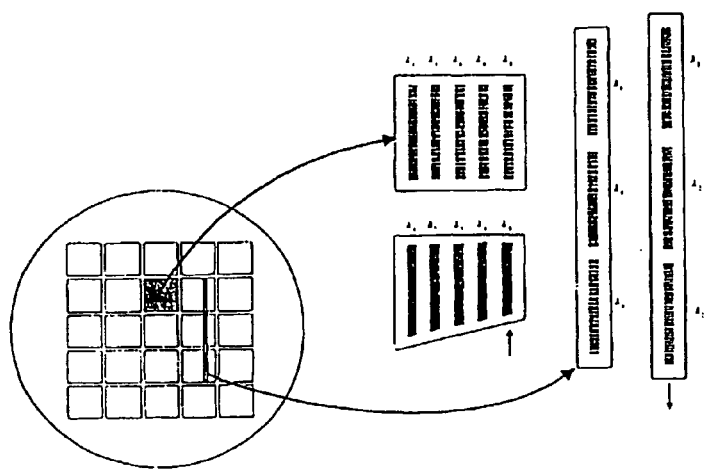
FIG. 5 shows two examples of the use of the deformability of an elastomeric stamp to form grating features of DFR lasers.

In FIG. 5, a matrix of arrays is depicted. Each array of devices is here considered as a separate chip that is patterned individually. Stamping, however, allows for printing in unusually shaped or small areas, so that patterning the grating for an individual device is conceivable, allowing a greater flexibility in the choice of the grating pitch. The combination of the deformability of the stamp 8 together with the ability to print relatively small and unusually shaped areas is particularly advantageous. A set of devices comprising for example an array of ten lasers arranged in a line each differing in pitch and phase, can be manufactured by using the described deformation during patterning and stepping 10 times to iteratively form the gratings for a 100-wavelengths laser array. Repeated cycles of these steps complete the pattern of gratings on the wafer.

There is also a second use of the described deformable stamp 8. It is also possible that the elastomeric stamp 8 could be used as a master in near-field holography. Here the stamp 8 can be used instead of a silica master to create the patterned exposure of a resist. The disadvantage of this technique of its vulnerability to occlusion and change of the features of the stamp 8 is alleviated by the low cost of producing another stamp by replication from the e-beam master. This step does substantially cause no wear in the master, as mentioned above. The advantage of the conformal contact between the stamp 8 and the resist provides the alternative advantage of compensating the inherent stress and deformation typical in contact lithography. This stress might be particularly reducing yield on a wafer with several devices, as the accumulated effect causes undesired changes in the absolute pitch at different points along the surface of the wafer.

It is also possible that the elastomeric stamp 8 is used as master in UV-molding or step-and-flash imprint lithography. Here, the stamp 8 is used instead of the rigid quartz master similar to the example above, the stamp 8 can be replicated several times from the e-beam original. The advantage of a thin-film PDMS stamp 8 on a bendable carrier is that the pressure is distributed evenly over the surface and the molded resist has a more reproducible thickness. The low-viscous pre-polymer may be beneficial since it facilitates relative movements of the stamp 8 against the substrate 2 through liquid lubrication. In particular, surface modifications of the polymer and the substrate 2 can be used to affect easy separation of the two, as when the PDMS has a fluorinated silane on its surface, for example.

The applicability of the present invention can be extended from a one-dimensional case to a two-dimensional case: The elastic tuning of the stamp 8 can also be applied in two dimensions of space, either isotropically, or anisotropically. In the first case, the stamp is deformed in both dimensions by the same factor, thus in the example of an optical grating changing the resonance wavelengths by this factor. In the second case, the wavelength bands can be distorted to allow design and quick test of novel optical properties. Structures like the latter are difficult to be fabricated by other methods since e-beam lithography tools use regular lattices for exposure.

The described embodiments show the advantage of stretching and/or compressing of a predefined grating to adjust the pitch of the grating to the emission wavelength for, e.g., a particular laser.

An advantageous tuning scheme uses lock structures on the substrate 2 that match with key structures on the stamp 8 to stretch and/or compress it to a desired value, e.g. given by a calibration run of the system. Using this approach, each laser or filter of the array can be individually calibrated and tuned for the subsequent fabrication run to improve the emission at a desired wavelength. This scheme could be extended to allow generation of a set of gratings on the master that is proportionally stretched to allow different numbers of lasers with differently pitched emission wavelengths to be manufactured.

A two-dimensional periodic pattern with variation of the periodicity in two directions of the plane can be used, e.g., in filter functions of photonic-bandgap structures. Such distorted two-dimensional patterns could also be used to couple light in a photonic-bandgap structure with high selectivity.

A grating array with chirps, i.e., an array with continuous variation in pitch, is another example of a distorted pattern. The chirps could be introduced by a deformation of the stamp 8 at an angle slanted to the grating variation. All the above patterns can also be used for sensor applications.

The invention claimed is:

1. Method for creating a pattern on a substrate comprising a first alignment structure using an elastomeric stamp comprising a patterning structure and a second alignment structure the method comprising the steps of:
   moving the elastomeric stamp towards the substrate and deforming the patterning structure with a tensile or compressive force generated by cooperation of the first alignment structure and the second alignment structure.

2. Method according to claim 1, wherein a translational movement of the elastomeric stamp relative to the substrate is transformed into a tensile or compressive force.

3. Method according to claim 2, wherein the transformation is performed under use of the alignment structures being designed to comprise an inclined surface relative to the direction of the translational movement and relative to the patterning structure.

4. Method according to claim 1, further comprising an alignment step for bringing the first alignment structure and second alignment structure together.

5. Method according to claim 1, further comprising a coating step for coating the patterning structure of the elastomeric stamp.

6. Method according to claim 1, wherein the patterning structure is selected to comprise a grating structure.

7. Method according to claim 1, wherein said the tensile or compressive force is generated in two dimensions, preferably orthogonal to each other.

8. Method according to claim 1, wherein on the same substrate a tensile force is generated in an elongative direction and a compressive force is generated in a compressive direction.

* * * * *